US012660086B2

(12) United States Patent
Gara et al.

(10) Patent No.: US 12,660,086 B2
(45) Date of Patent: Jun. 16, 2026

(54) COMPUTING SYSTEM WITH CONNECTING BOARDS

(71) Applicant: Samsung Electronics Co., Ltd., Suwon-si (KR)

(72) Inventors: Alan Gara, Palo Alto, CA (US); Young-Jun Hong, Seoul (KR); Eric Richard Borch, Fort Collins, CO (US); Casey Thielen, Chandler, AZ (US)

(73) Assignee: Samsung Electronics Co., Ltd., Suwon-si (KR)

( * ) Notice: Subject to any disclaimer, the term of this patent is extended or adjusted under 35 U.S.C. 154(b) by 285 days.

(21) Appl. No.: 18/490,678

(22) Filed: Oct. 19, 2023

(65) Prior Publication Data

US 2024/0314930 A1 Sep. 19, 2024

Related U.S. Application Data

(60) Provisional application No. 63/452,121, filed on Mar. 14, 2023.

(51) Int. Cl.
 H05K 1/14 (2006.01)
 H04L 49/00 (2022.01)
 H05K 7/14 (2006.01)
(52) U.S. Cl.
 CPC ............... H05K 1/14 (2013.01); H04L 49/70 (2013.01); H05K 7/1445 (2013.01); H05K 2201/044 (2013.01)
(58) Field of Classification Search
 None
 See application file for complete search history.

(56) References Cited

U.S. PATENT DOCUMENTS 3,648,113 A * 3/1972 Rathjen .............. H05K 7/20563
 361/689
3,699,295 A * 10/1972 Shinohara .............. H01H 67/26
 200/175

(Continued)

FOREIGN PATENT DOCUMENTS

CH 664662 A5 * 3/1988 ........... H05K 7/1442
CN 107124671 A 9/2017

(Continued)

OTHER PUBLICATIONS

Extended European Search Report for EP Application No. 24163213.2 dated Jul. 30, 2024, 7 pages.

*Primary Examiner* — Timothy J. Dole
*Assistant Examiner* — Muhammed Azam
(74) *Attorney, Agent, or Firm* — Womble Bond Dickinson (US) LLP

(57) ABSTRACT

A computing system with connecting boards may include a first compute board, a second compute board, and a first connecting board connected to the first compute board and to the second compute board. The first compute board and the second compute board may include a plurality of compute elements. The first compute board, the second compute board, and the first connecting board may include a first plurality of switches including a first switch connected to a first compute element of the plurality of compute elements and a second switch connected to a second compute element of the plurality of compute elements. The first connecting board may include a first conductor, the first conductor being a conductor of a first data connection between the first switch and the second switch.

19 Claims, 6 Drawing Sheets

Compute boards (e.g., 20 or more)

(56) References Cited

U.S. PATENT DOCUMENTS

| | | | | | |
|---|---|---|---|---|---|
| 3,727,168 | A | * | 4/1973 | Henschen | H01R 31/02 |
| | | | | | 361/776 |
| 3,808,566 | A | * | 4/1974 | Thompson | H01H 67/26 |
| | | | | | 333/205 |
| 4,133,592 | A | * | 1/1979 | Cobaugh | H01R 12/88 |
| | | | | | 439/74 |
| 4,237,546 | A | * | 12/1980 | Wells | H05K 1/14 |
| | | | | | 710/100 |
| 4,253,143 | A | * | 2/1981 | Onodera | G06F 15/7864 |
| | | | | | 708/108 |
| 4,498,717 | A | * | 2/1985 | Reimer | H05K 7/1445 |
| | | | | | 439/62 |
| 4,733,461 | A | * | 3/1988 | Nakano | H05K 1/144 |
| | | | | | 29/830 |
| 4,734,825 | A | * | 3/1988 | Peterson | H01L 25/0657 |
| | | | | | 361/792 |
| 4,838,798 | A | * | 6/1989 | Evans | H01R 12/7082 |
| | | | | | 439/493 |
| 4,868,712 | A | * | 9/1989 | Woodman | H05K 7/023 |
| | | | | | 361/689 |
| 5,058,053 | A | * | 10/1991 | Gillett | G06F 13/4022 |
| | | | | | 710/317 |
| 5,060,111 | A | * | 10/1991 | Takashima | G06F 13/409 |
| | | | | | 361/679.48 |
| 5,111,200 | A | * | 5/1992 | Jasmer | H04Q 3/521 |
| | | | | | 340/2.21 |
| 5,134,508 | A | * | 7/1992 | Corda | G02B 6/2808 |
| | | | | | 398/128 |
| 5,150,279 | A | * | 9/1992 | Collins | G06F 15/17375 |
| | | | | | 361/689 |
| 5,181,167 | A | * | 1/1993 | Davidson | H05K 7/023 |
| | | | | | 174/16.3 |
| 5,211,565 | A | * | 5/1993 | Krajewski | H01R 12/79 |
| | | | | | 361/735 |
| 5,335,146 | A | * | 8/1994 | Stucke | H05K 1/14 |
| | | | | | 361/744 |
| 5,341,509 | A | * | 8/1994 | Takashima | H05K 7/1442 |
| | | | | | 361/784 |
| 5,481,073 | A | * | 1/1996 | Singer | H01P 3/081 |
| | | | | | 307/115 |
| 5,519,584 | A | * | 5/1996 | Siroky | H05K 7/1442 |
| | | | | | 439/62 |
| 5,536,177 | A | * | 7/1996 | Casey | H05K 7/023 |
| | | | | | 439/74 |
| 5,677,569 | A | * | 10/1997 | Choi | H01L 25/0657 |
| | | | | | 257/725 |
| 5,729,752 | A | * | 3/1998 | Snider | H05K 1/14 |
| | | | | | 712/1 |
| 6,261,104 | B1 | * | 7/2001 | Leman | H01R 12/721 |
| | | | | | 439/752 |
| 6,392,142 | B1 | * | 5/2002 | Uzuka | H05K 7/1445 |
| | | | | | 174/541 |
| 6,422,876 | B1 | * | 7/2002 | Fitzgerald | H01R 12/716 |
| | | | | | 439/631 |
| 6,538,899 | B1 | * | 3/2003 | Krishnamurthi | H05K 7/1445 |
| | | | | | 361/791 |
| 6,608,762 | B2 | * | 8/2003 | Patriche | H05K 7/1445 |
| | | | | | 361/799 |
| 6,690,584 | B2 | * | 2/2004 | Uzuka | G06F 1/185 |
| | | | | | 361/810 |
| 6,795,885 | B1 | * | 9/2004 | deBlanc | H05K 7/1441 |
| | | | | | 710/305 |
| 6,922,342 | B2 | * | 7/2005 | Doblar | G06F 11/2015 |
| | | | | | 439/631 |
| 6,964,574 | B2 | * | 11/2005 | Pavesi | G06F 30/331 |
| | | | | | 439/74 |

| | | | | | |
|---|---|---|---|---|---|
| 7,030,486 | B1 | * | 4/2006 | Marshall | H01L 25/0652 |
| | | | | | 361/709 |
| 7,050,307 | B2 | * | 5/2006 | Doblar | H05K 7/1444 |
| | | | | | 361/736 |
| 7,296,106 | B2 | | 11/2007 | Doblar et al. | |
| 7,298,625 | B1 | * | 11/2007 | Wu | G11C 5/04 |
| | | | | | 361/736 |
| 7,821,792 | B2 | * | 10/2010 | Belady | H05K 1/14 |
| | | | | | 361/679.01 |
| 7,929,310 | B2 | * | 4/2011 | Belady | H05K 1/14 |
| | | | | | 361/679.01 |
| 8,131,903 | B2 | * | 3/2012 | Pearson | H05K 1/14 |
| | | | | | 711/115 |
| 8,214,786 | B2 | * | 7/2012 | Kuekes | G06F 30/18 |
| | | | | | 716/119 |
| 8,358,511 | B2 | * | 1/2013 | Huels | H05K 7/1492 |
| | | | | | 361/788 |
| 8,880,938 | B2 | * | 11/2014 | Armstrong | G06F 11/326 |
| | | | | | 714/4.12 |
| 9,542,343 | B2 | * | 1/2017 | Kim | G06F 13/4022 |
| 9,645,960 | B2 | * | 5/2017 | Park | G06F 13/385 |
| 9,735,481 | B2 | * | 8/2017 | Costello | H01R 9/2408 |
| 9,785,594 | B2 | * | 10/2017 | Zou | G06F 13/4068 |
| 10,466,923 | B2 | * | 11/2019 | Ping | G06F 13/362 |
| 10,476,816 | B2 | * | 11/2019 | Leung | G06F 13/4278 |
| 10,512,187 | B2 | * | 12/2019 | Chen | H01R 43/20 |
| 10,841,246 | B2 | * | 11/2020 | Bechtolsheim | H05K 7/1444 |
| 10,996,896 | B2 | * | 5/2021 | Worley | G06F 3/0629 |
| 11,003,616 | B1 | * | 5/2021 | Nakibly | G06F 13/4013 |
| 11,202,378 | B1 | * | 12/2021 | Gao | H05K 5/0291 |
| 11,575,594 | B2 | * | 2/2023 | Yallouz | H04L 12/44 |
| 11,822,491 | B2 | * | 11/2023 | Feehrer | G06F 13/1652 |
| 2002/0162083 | A1 | * | 10/2002 | Fowler | H05K 7/1444 |
| | | | | | 716/130 |
| 2002/0181215 | A1 | * | 12/2002 | Guenthner | H05K 1/14 |
| | | | | | 361/784 |
| 2003/0100198 | A1 | * | 5/2003 | Hicks | G06F 1/186 |
| | | | | | 439/65 |
| 2004/0001311 | A1 | * | 1/2004 | Doblar | H05K 7/1444 |
| | | | | | 361/695 |
| 2004/0023558 | A1 | * | 2/2004 | Fowler | G06F 13/4278 |
| | | | | | 439/632 |
| 2005/0048805 | A1 | * | 3/2005 | Budny | H01R 12/52 |
| | | | | | 439/65 |
| 2005/0186807 | A1 | * | 8/2005 | Budny | H01R 12/52 |
| | | | | | 439/65 |
| 2005/0270750 | A1 | * | 12/2005 | Sarno | H01L 25/18 |
| | | | | | 361/721 |
| 2006/0176677 | A1 | * | 8/2006 | Glovatsky | H05K 7/1434 |
| | | | | | 361/796 |
| 2008/0112133 | A1 | * | 5/2008 | Torudbakken | H04Q 1/06 |
| | | | | | 361/837 |
| 2013/0010639 | A1 | * | 1/2013 | Armstrong | H04L 49/15 |
| | | | | | 370/254 |
| 2017/0093065 | A1 | | 3/2017 | Wang et al. | |
| 2018/0032461 | A1 | * | 2/2018 | Zhang | G06F 13/4022 |
| 2018/0089127 | A1 | * | 3/2018 | Flajslik | G06F 13/4022 |
| 2021/0160100 | A1 | | 5/2021 | Steinmacher-Burow et al. | |
| 2023/0253294 | A1 | * | 8/2023 | Lee | H01L 23/49833 |
| | | | | | 257/690 |
| 2024/0310897 | A1 | * | 9/2024 | Borch | H04L 49/00 |
| 2024/0311323 | A1 | * | 9/2024 | Borch | G06F 11/3495 |
| 2024/0314089 | A1 | * | 9/2024 | Borch | H04L 47/2441 |
| 2024/0314930 | A1 | * | 9/2024 | Gara | H05K 1/14 |

FOREIGN PATENT DOCUMENTS

| | | | | |
|---|---|---|---|---|
| EP | 0466394 A2 | * | 1/1992 | H05K 7/1442 |
| WO | 2020190314 A1 | | 9/2020 | |

* cited by examiner

Compute boards (e.g., 20 or more)

Send a packet, by a first compute element of a first compute board of a computing system, to a second compute element of a second compute board of the computing system

305

COMPUTING SYSTEM WITH CONNECTING BOARDS

CROSS-REFERENCE TO RELATED APPLICATION(S)

The present application claims priority to and the benefit of U.S. Provisional Application No. 63/452,121, filed Mar. 14, 2023, entitled "METHOD FOR CONNECTING COMPUTE NODES ACROSS MULTIPLE BOARDS IN HIGH BANDWIDTH EFFICIENT FASHION", the entire content of which is incorporated herein by reference.

FIELD

One or more aspects of embodiments according to the present disclosure relate to computing systems, and more particularly to a computing system with connecting boards.

BACKGROUND

Modern computing systems may include one or more compute boards, each including processing resources, such as a central processing unit (CPU) and storage resources, such as memory or persistent storage.

It is with respect to this general technical environment that aspects of the present disclosure are related.

SUMMARY

According to an embodiment of the present disclosure, there is provided a system, including: a first compute board; a second compute board; and a first connecting board connected to the first compute board and to the second compute board, the first compute board and the second compute board including a plurality of compute elements, the first compute board, the second compute board, and the first connecting board including a first plurality of switches including a first switch connected to a first compute element of the plurality of compute elements and a second switch connected to a second compute element of the plurality of compute elements, and the first connecting board including a first conductor, the first conductor being a conductor of a first data connection between the first switch and the second switch.

In some embodiments, the first switch and the second switch are on the first connecting board.

In some embodiments, the first switch and the second switch are on the first compute board and the second compute board, respectively.

In some embodiments, the system includes a plurality of compute boards, including the first compute board and the second compute board, the plurality of compute boards including 20 compute boards.

In some embodiments, the system includes a plurality of compute boards, including the first compute board and the second compute board, each of the compute boards including a respective plurality of compute elements, the system including, in total, more than 100 compute elements.

In some embodiments, the system includes a first network plane including the first plurality of switches and the first conductor.

In some embodiments: the first compute board includes a printed circuit board, and the first connecting board includes a printed circuit board perpendicular to the printed circuit board of the first compute board.

In some embodiments, each switch of the first plurality of switches is connected to each other switch of the first plurality of switches.

In some embodiments, each switch of the first plurality of switches is configured to operate as a packet switch or a circuit switch.

In some embodiments, each switch of the first plurality of switches is configured to process packets formatted according to a protocol selected from the group consisting of Ethernet, Peripheral Component Interface Express, and Compute Express Link.

In some embodiments, the system further includes a second connecting board, wherein: the second connecting board includes a second conductor, the second conductor being a conductor of a second data connection between a third switch and a fourth switch.

In some embodiments, method, including: sending a packet, by a first compute element of a first compute board of a computing system, to a second compute element of a second compute board of the computing system, the computing system including a first connecting board connected to the first compute board and to the second compute board, the first compute board and the second compute board including a plurality of compute elements including the first compute element and the second compute element, the first compute board, the second compute board, and the first connecting board including a first plurality of switches including a first switch connected to the first compute element and a second switch connected to the second compute element, and the first connecting board including a first conductor, the first conductor being a conductor of a first data connection between the first switch and the second switch.

In some embodiments, the first switch and the second switch are on the first connecting board.

In some embodiments, the first switch and the second switch are on the first compute board and the second compute board, respectively.

In some embodiments, the computing system includes a plurality of compute boards, including the first compute board and the second compute board, the plurality of compute boards including 20 compute boards.

In some embodiments, the computing system includes a plurality of compute boards, including the first compute board and the second compute board, each of the compute boards including a respective plurality of compute elements, the computing system including, in total, more than 100 compute elements.

In some embodiments, the computing system includes a first network plane including the first plurality of switches and the first conductor.

In some embodiments: the first compute board includes a printed circuit board, and the first connecting board includes a printed circuit board perpendicular to the printed circuit board of the first compute board.

In some embodiments, each switch of the first plurality of switches is connected to each other switch of the first plurality of switches.

According to an embodiment of the present disclosure, there is provided a system, including: a first compute board; a second compute board; and a means for connecting connected to the first compute board and to the second compute board, the first compute board and the second compute board including a plurality of compute elements, the first compute board, the second compute board, and the means for connecting including a first plurality of switches including a first switch connected to a first compute element of the plurality of compute elements and a second switch connected to a second compute element of the plurality of compute elements, and the means for connecting including a first conductor, the first conductor being a conductor of a first data connection between the first switch and the second switch.

BRIEF DESCRIPTION OF THE DRAWINGS

These and other features and advantages of the present disclosure will be appreciated and understood with reference to the specification, claims, and appended drawings wherein:

Figure 1A:
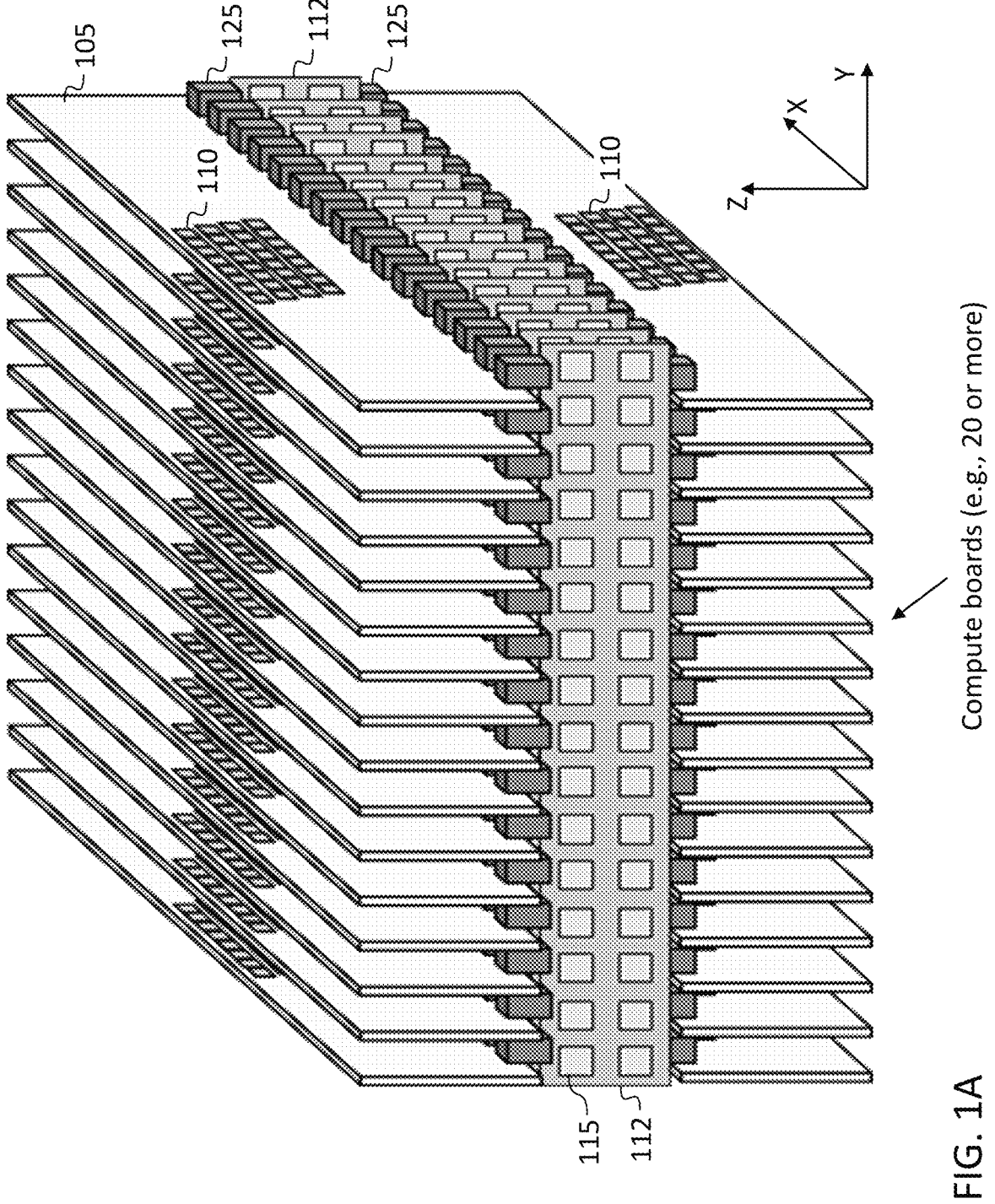
FIG. 1A is a perspective view of a computing system, according to an embodiment of the present disclosure.
Figure 1B:
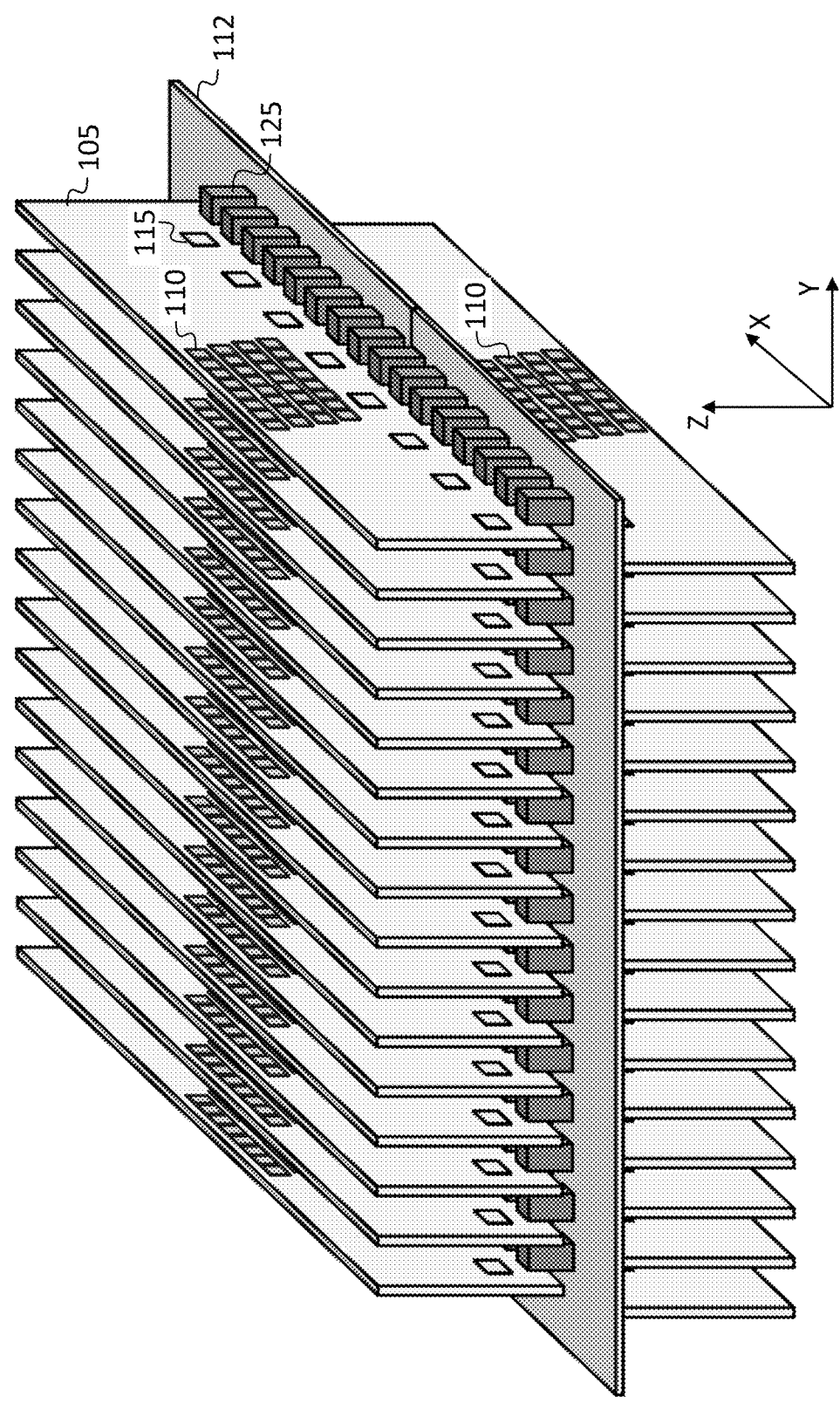
FIG. 1B is a perspective view of a computing system, according to an embodiment of the present disclosure.

Each of FIGS. 1A and 1B is drawn to scale, for a respective embodiment.

DETAILED DESCRIPTION

The detailed description set forth below in connection with the appended drawings is intended as a description of exemplary embodiments of a computing system with connecting boards provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In a computing system with a plurality of interconnected nodes, the ability to create a large compute domain may depend on the bandwidth allowances given between the nodes. As the node-count increases, bandwidth requirements across a grouping of nodes (which may be referred to as a "supernode") may grow. It may however be advantageous to allow all the nodes to communicate with each other with as few hops between nodes as possible.

As such, some embodiments provide a high speed interconnect on a connecting board (referred to herein as a "mid-plane board") using a low diameter topology to connect all compute elements on all compute boards connected to the mid-plane board. Some embodiments accomplish this in a single rack or enclosure, and without the use of cables. In some embodiments, each mid-plane board provides full connectivity between any two (of 1024) connected compute elements via a single hop.

Some embodiments connect hundreds (or more) of nodes (e.g., compute boards) with a single hop between switches, and, as a result, bisection bandwidth and injection bandwidth both may increase substantially, improving the functionality of certain types of workloads.

Referring to FIG. 1A, in some embodiments, each compute board 105 of a plurality of compute boards 105 includes a plurality of compute elements 110 and is connected to a plurality of mid-plane boards 112. Each mid-plane board 112 may include a plurality of switches 115. Each of the switches 115 on a mid-plane board 112 may be dedicated to one of the compute boards 105 and may be connected to (i) each of the other switches 115 on the mid-plane board 112 and (ii) all of the compute elements 110 on the compute boards 105 to which it is dedicated. Each of the compute elements 110 and each of the switches 115 may be a processing circuit (discussed in further detail below).

As a result of this set of connections, any compute element 110 may send a communication to any other compute element 110 through a data path that includes only two switches 115 and one hop (between the two switches). Such a data path may extend through any one of the mid-plane boards 112, and there are as many such paths as there are mid-plane boards 112. The path from a first compute element 110 on a first compute board 105, to a second compute element 110 on a second compute board 105, through a first mid-plane board 112, may extend (i) from the first compute element 110 to the switch 115, on the first mid-plane board 112, that is dedicated to the first compute board 105, (ii) from the switch 115, on the first mid-plane board 112, that is dedicated to the first compute board 105, to the switch 115, on the first mid-plane board 112, that is dedicated to the second compute board 105, and (iii) from the switch 115, on the first mid-plane board 112, that is dedicated to the second compute board 105, to the second compute element 110.

In the embodiment of FIG. 1A, the computing system includes 32 compute boards 105 each including 32 compute elements 110, for a total of 1024 compute elements 110. The computing system also includes 16 mid-plane boards 112, each including 32 switches. In some embodiments, the numbers of elements may be different. For example, the number of compute boards 105 in the computing system may be between 4 and 128, the number of compute elements 110 per compute board 105 may be between 4 and 512, the number of mid-plane boards 112 may be between 2 and 128, and the number of switches 115 per mid-plane board 112 may be between 4 and 128.

Each of the switches 115 may have a number of ports, a first plurality of which are connected to corresponding ports on other switches 115, and a second plurality of which are connected to corresponding ports on compute elements 110. The number of ports in the first plurality of ports may be one fewer than the number of switches 115 on the mid-plane board 112, and the number of ports in the second plurality of ports may be equal to the number of compute elements 110 per compute board 105.

The protocol followed by the ports of the second plurality of ports may be the same as, or different from, the protocol followed by the ports of the first plurality of ports. For example, the protocol followed by the ports of the first plurality of ports may be a packet-switched protocol, with, for example, each packet including a header and a payload, and each header including a destination address (e.g., an identifier of the compute element 110 to which the payload is to be delivered). The protocol followed by the ports of the second plurality of ports may be (as mentioned above) the same, or it may be different. Either or both of the protocols followed by the ports of the first plurality of ports and by the ports of the second plurality of ports, respectively, may be (or may be based on) Peripheral Component Interface Express (PCIe), Compute Express Link (CXL), or Ethernet.

The mid-plane boards 112 may be perpendicular to the compute boards 105, as shown in the embodiment of FIG. 1A, in which (referring to the X, Y, and Z axes illustrated) each of the mid-plane boards 112 is parallel to the Y-Z plane and each of the compute boards 105 is parallel to the X-Z plane. Each of the mid-plane boards 112 may be connected to each of the compute boards 105 by a respective connector 125. Each of the connectors 125 may be used to form connections between a respective one of the switches 115 on the mid-plane board 112 and the compute elements 110 of the compute board 105 to which the switch 115 is dedicated. As such, each one of the connectors 125 may include a sufficient number of conductors to form a number of bidirectional links equal to the number of compute elements 110 on the compute board 105. The number of conductors per link may be one (with a shared return, or ground, conductor for all of the links) or two (e.g., one (bidirectional) signal conductor and one ground conductor per link, or two unidirectional signal conductors (with a shared return, or ground, conductor for all of the links)) or three (e.g., two unidirectional signal conductors and a ground conductor).

FIG. 1B shows another embodiment including a plurality of compute boards 105, each including a plurality of compute elements 110, and a plurality of mid-plane boards 112 (two mid-plane boards 112). In the embodiment of FIG. 1B, like in the embodiment of FIG. 1A, a plurality of switches 115 form connections between the compute elements 110; in the embodiment of FIG. 1B, however, the switches 115 are on the compute boards 105 instead of being on the mid-plane boards 112. In the embodiment of FIG. 1B, each compute board has a plurality of switches 115 (e.g., 8 switches, as illustrated in FIG. 1B). Each of the switches 115 is, like in the embodiment of FIG. 1A, dedicated to a respective one of the compute boards 105; in the embodiment of FIG. 1B this is the compute board 105 on which the switch 115 is installed. Both in the embodiment of FIGS. 1A and 1$n$ the embodiment of FIG. 1B, the switches 115 are connected to each other in groups referred to herein as "network planes" (discussed in further detail below). For example, in FIG. 1B, the first switches 115 on the compute boards 105 (e.g., the switches at the position having, on each of the compute boards 105, the smallest X-coordinate, with respect to the X, Y, and Z axes illustrated) may be part of a first network plane, the second switches 115 on the compute boards 105 (e.g., the switches at the position having, on each of the compute boards 105, the second-smallest X-coordinate, with respect to the X, Y, and Z axes illustrated) may be part of a second network plane, and so forth. As such, the computing system of FIG. 1B, in which each of the compute boards 105 includes 8 switches 115, may include 8 network planes, each network plane including one of the switches 115 on each of the compute boards 105.

The mid-plane boards 112 may include conductors connecting together all of the switches 115 of each network plane, e.g., connecting each switch 115 of any one of the network planes to every other switch 115 of the network plane. Connectors on the mid-plane boards 112 may provide conductive connections through which each switch is connected to each of the other switches 115 of the network plane. For example, like the embodiment of FIG. 1A, the embodiment of FIG. 1B includes 32 compute boards 105 each including 32 compute elements 110 (for a total of 1024 compute elements 110). As such, each network plane includes 32 switches 115, each connected to (i) the 31 other switches 115 of the network plane and (ii) the 32 compute elements 110 of the board on which the switch 115 is installed.

As in the embodiment of FIG. 1A, in the embodiment of FIG. 1B the numbers of elements may be different. For example, the number of compute boards 105 in the computing system may be between 4 and 128, the number of compute elements 110 per compute board 105 may be between 4 and 512, the number of mid-plane boards 112 may be between 2 and 8, and the number of switches 115 per compute board 105 may be between 2 and 32. In the embodiment of FIG. 1B, the mid-plane boards 112 are perpendicular to the compute boards 105; referring to the X, Y, and Z axes illustrated each of the mid-plane boards 112 is parallel to the X-Y plane and each of the compute boards 105 is parallel to the X-Z plane.

In some embodiments, the computing system (according to FIG. 1A or according to FIG. 1B) is sufficiently compact to be accommodated by a single rack, e.g., it may have dimensions not exceeding 750 mm×750 mm×750 mm. In some embodiments, it has a volume not exceeding 1 cubic meter, or not exceeding a volume between 0.5 cubic meters and 3.0 cubic meters. Each of the compute boards 105 may include one or more memories (or "memory circuits") (e.g., dynamic random-access memories (DRAMs) or High Bandwidth Memories (HBMs)), used to store instructions for execution by the compute elements 110 and data for processing by the compute elements 110. Some or all of the memories (or some portions of the memories) may be shared by (and accessible by) all of the compute elements 110 of the computing system in the sense that any one of the compute elements 110 may be able to read from any shared memory location (including shared memory locations on other compute boards 105) (e.g., through the network connections) using a load instruction, and any one of the compute elements 110 may be able to write to any shared memory location (including shared memory locations on other compute boards 105) using a store instruction. Each of the boards (e.g., each of the compute boards 105 and each of the mid-plane boards 112) may be a printed circuit board. In the embodiment of FIG. 1A, each mid-plane board 112 includes switches and conductors for forming data connections between the switches; in the embodiment of FIG. 1B, the switches are instead on the compute boards 105 and each mid-plane board 112 includes conductors for forming data connections between the switches.

Figure 2A:
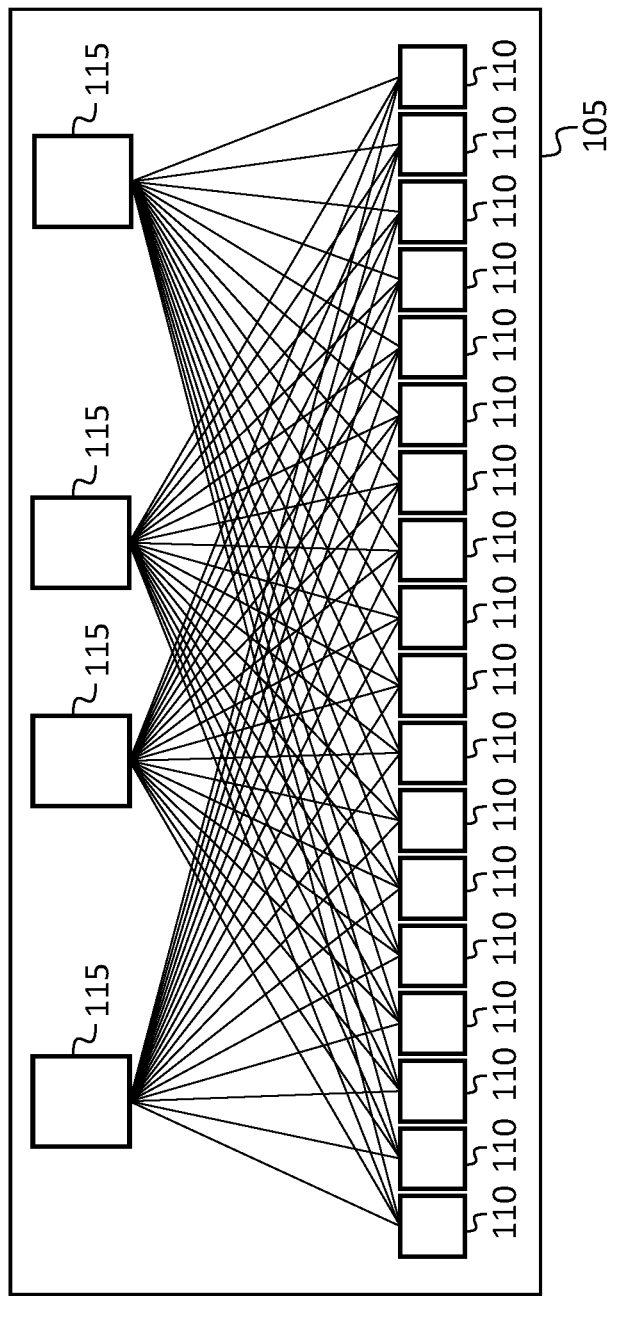
FIG. 2A is a schematic block diagram of a compute board, according to an embodiment of the present disclosure.

FIG. 2A is a schematic drawing of a compute board 105. The embodiment of FIGS. 2A-2D is analogous to the embodiment of FIG. 1B in that the switches 115 are on the compute boards 105. Network planes 120 as described in the context of FIGS. 2A-2D may be implemented in an analogous manner, in an embodiment in which the switches 115 are not on the compute boards 105 (and, e.g., are instead on the mid-plane boards 112) but are connected to each other and to the compute elements 110 in the same manner. The compute board 105 is shown to include 18 compute elements 110 and four switches 115 for ease of illustration; as mentioned above, in other embodiments a compute board 105 may include more or fewer compute elements 110 or more or fewer switches 115. The compute board 105 includes a plurality of compute elements 110 and a plurality of switches 115. Each of the switches 115 may be connected to all of the compute elements 110 on the compute board 105, as shown.

Figure 2B:
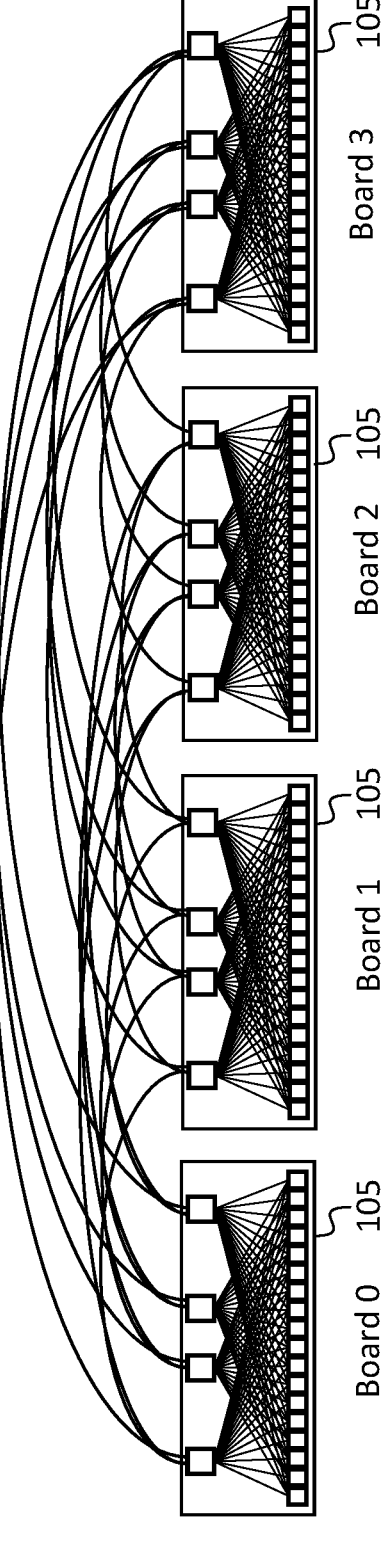
FIG. 2B is a schematic block diagram of a computing system, according to an embodiment of the present disclosure.
Figure 2C:
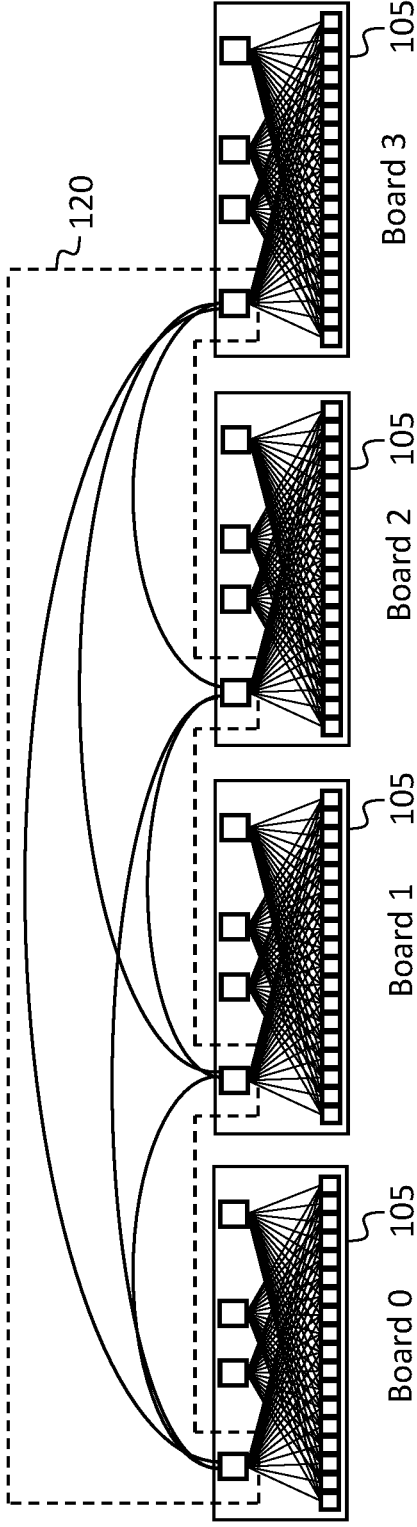
FIG. 2C is a schematic block diagram of a portion of a computing system, according to an embodiment of the present disclosure.
Figures 2D, 3:
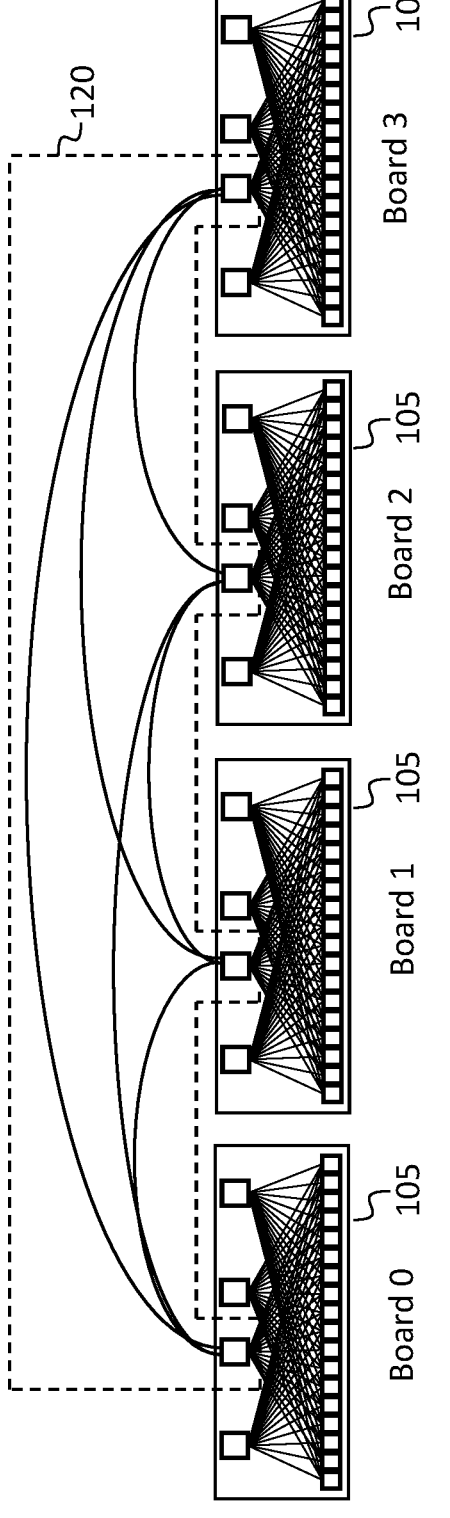
FIG. 2D is a schematic block diagram of a portion of a computing system, according to an embodiment of the present disclosure.
FIG. 3 is a flow chart of a method, according to an embodiment of the present disclosure.

FIG. 2B is a schematic block diagram of a computing system including four compute boards 105, labeled Board 0, Board 1, Board 2, and Board 3. Each compute board 105 may include computing resources, storage resources, and networking resources, and the compute boards 105 may be connected together by network, as discussed above, and in further detail below. FIG. 2B shows a system with four compute boards 105 for ease of illustration; as discussed above, other embodiments may include more or fewer compute boards 105. As shown in FIG. 2B, the network may include a plurality of network planes 120 (two of which are illustrated in FIGS. 2C and 2D respectively), each network plane 120 including a switch 115 on each of the compute boards 105 and connections between each of the pairs of switches in the network plane 120. FIG. 2C shows an example of such a network plane 120, which may be referred to herein as the first network plane 120. The network plane 120 illustrated in FIG. 2C includes one switch 115 (the leftmost switch 115) of each of the compute boards 105, and a network connection between each pair of the switches 115 of the network plane 120. Because, on each of the compute boards 105, the switch 115 of the first network plane 120 is connected to all of the compute elements 110 of the compute board 105, the first network plane 120 is sufficient to enable communications, via the first network plane 120, between any of the compute elements 110 on any one of the compute boards 105 and any of the compute elements 110 on any one of the other compute boards 105.

As mentioned above, and as illustrated in FIG. 2B, additional network planes may be present. For example, FIG. 2D shows a second network plane 120, including a second switch 115 of each of the compute boards 105 (the second switch from the left of each of the compute boards 105) and a network connection between each pair of switches 115 of this set of switches 115. Like the first network plane 120, the second network plane 120 has the characteristic that on each of the compute boards 105, the switch 115 of the second network plane 120 is connected to all of the compute elements 110 of the compute board 105. As such, like the first network plane 120, the second network plane 120 is sufficient to enable communications, via the second network plane 120, between any of the compute elements 110 on any one of the compute boards 105 and any of the compute elements 110 on any one of the other compute boards 105. In some embodiments, the network planes 120 are independent in the sense that there is no data path between any two network planes 120 that does not traverse one of the compute elements 110. As used herein, "means for connecting" includes a printed circuit board (e.g., a mid-plane board 112 according to the embodiment of FIG. 1A or according to the embodiment of FIG. 1B), or alternatives with similar function, such as cables or flex circuits.

FIG. 3 is a flow chart of a method, in some embodiments. The method includes: sending a packet, at 305, by a first compute element of a first compute board of a computing system, to a second compute element of a second compute board of the computing system. The computing system may include a first connecting board connected to the first compute board and to the second compute board, the first compute board and the second compute board including a plurality of compute elements including the first compute element and the second compute element, the first compute board, the second compute board, and the first connecting board including a first plurality of switches including a first switch connected to the first compute element and a second switch connected to the second compute element, and the first connecting board including a first conductor, the first conductor being a conductor of a first data connection between the first switch and the second switch.

In some embodiments, the first switch and the second switch are on the first connecting board. In some embodiments, the first switch and the second switch are on the first compute board and the second compute board, respectively. In some embodiments, the computing system includes a plurality of compute boards, including the first compute board and the second compute board, the plurality of compute boards including 20 compute boards. In some embodiments, the computing system includes a plurality of compute boards, including the first compute board and the second compute board, each of the compute boards including a respective plurality of compute elements, the computing system including, in total, more than 100 compute elements.

In some embodiments, the computing system includes a first network plane including the first plurality of switches and the first conductor. In some embodiments: the first compute board includes a printed circuit board, and the first connecting board includes a printed circuit board perpendicular to the printed circuit board of the first compute board. In some embodiments, each switch of the first plurality of switches is connected to each other switch of the first plurality of switches.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X-Y and the second quantity is at most X+Y. As used herein, when a second number is "within Y %" of a first number, it means that the second number is at least $(1-Y/100)$ times the first number and the second number is at most $(1+Y/100)$ times the first number. As used herein, the term "or" should be interpreted as "and/or", such that, for example, "A or B" means any one of "A" or "B" or "A and B".

Each of the terms "processing circuit" and "means for processing" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., $(1-35/100)$ times 10) and the recited maximum value of 13.5 (i.e., $(1+35/100)$ times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of a computing system with connecting boards have been specifically described and illustrated herein, many modifications and variations will be apparent to those skilled in the art. Accordingly, it is to be understood that a computing system with connecting boards constructed according to principles of this disclosure may be embodied other than as specifically described herein. The invention is also defined in the following claims, and equivalents thereof.

What is claimed is:

1. A system, comprising:
a first compute board;
a second compute board; and
a first connecting board and a second connecting board, both connected to the first compute board and to the second compute board,
the first compute board and the second compute board each comprising a first compute element and a second compute element,
the first compute board, the second compute board, the first connecting board, and the second connecting board together comprising:
a first switch connected to the first compute element of the first compute board and to the second compute element of the first compute board; and
a second switch connected to the first compute element of the second compute board and to the second compute element of the second compute board,
the first connecting board comprising a first conductor of a data connection between the first switch and the second switch, and
the second connecting board comprising a second conductor of a data connection between the first compute element of the first compute board and the first compute element of the second compute board.

2. The system of claim 1, wherein the first switch and the second switch are on the first connecting board.

3. The system of claim 1, wherein the first switch and the second switch are on the first compute board and the second compute board, respectively.

4. The system of claim 1, comprising a plurality of compute boards, including the first compute board and the second compute board, the plurality of compute boards comprising 20 compute boards.

5. The system of claim 1, comprising a plurality of compute boards, including the first compute board and the second compute board, each of the plurality of compute boards comprising a respective plurality of compute elements, the system comprising, in total, more than 100 compute elements.

6. The system of claim 5, comprising a first network plane comprising the first switch, the second switch, and the first conductor.

7. The system of claim 1 wherein:

the first compute board comprises a printed circuit board, and the first connecting board comprises a printed circuit board perpendicular to the printed circuit board of the first compute board.

8. The system of claim 1, further comprising a third switch connected to a first compute element of a third compute board and to a second compute element of the third compute board, wherein the first switch is connected to the second switch and to the third switch.

9. The system of claim 1, wherein the first switch is configured to operate as a packet switch or a circuit switch.

10. The system of claim 9, wherein the first switch is configured to process packets formatted according to a protocol selected from the group consisting of Ethernet, Peripheral Component Interface Express, and Compute Express Link.

11. A method, comprising:

sending a packet, by a first compute element of a first compute board of a computing system, to a first compute element of a second compute board of the computing system, the computing system comprising a first connecting board and a second connecting board, both connected to the first compute board and to the second compute board, the first compute board and the second compute board each comprising the respective first compute element and a second compute element, the first compute board, the second compute board, the first connecting board and the second connecting board together comprising:

a first switch connected to the first compute element of the first compute board and to the second compute element of the first compute board; and a second switch connected to the first compute element of the second compute board and to the second compute element of the second compute board, the first connecting board comprising a first conductor of a first data connection between the first switch and the second switch, and the second connecting board comprising a second conductor of a data connection between the first compute element of the first compute board and the first compute element of the second compute board.

12. The method of claim 11, wherein the first switch and the second switch are on the first connecting board.

13. The method of claim 11, wherein the first switch and the second switch are on the first compute board and the second compute board, respectively.

14. The method of claim 11, wherein the computing system comprises a plurality of compute boards, including the first compute board and the second compute board, the plurality of compute boards comprising 20 compute boards.

15. The method of claim 11, wherein the computing system comprises a plurality of compute boards, including the first compute board and the second compute board, each of the compute boards comprising a respective plurality of compute elements, the computing system comprising, in total, more than 100 compute elements.

16. The method of claim 15, wherein the computing system comprises a first network plane comprising the first switch, the second switch, and the first conductor.

17. The method of claim 11 wherein:

the first compute board comprises a printed circuit board, and the first connecting board comprises a printed circuit board perpendicular to the printed circuit board of the first compute board.

18. The method of claim 11, wherein:

the computing system further comprises a third switch connected to a first compute element of a third compute board and to a second compute element of the third compute board, and the first switch is connected to the second switch and to the third switch.

19. A system, comprising:

a first compute board;

a second compute board; and a first means for connecting and a second means for connecting, both connected to the first compute board and to the second compute board, the first compute board and the second compute board each comprising a first compute element and a second compute element, the first compute board, the second compute board, the first means for connecting, and the second means for connecting together comprising:

a first switch connected to the first compute element of the first compute board and to the second compute element of the first compute board; and a second switch connected to the first compute element of the second compute board and to the second compute element of the second compute board, the first means for connecting comprising a first conductor of a first data connection between the first switch and the second switch, and the second means for connecting comprising a second conductor of a data connection between the first compute element of the first compute board and the first compute element of the second compute board.

* * * * *